United States Patent

[11] 3,599,203

[72] Inventor James W. Conley
Scotia, N.Y.
[21] Appl No. 846,007
[22] Filed July 30, 1969
[45] Patented Aug. 10, 1971
[73] Assignee General Electric Company

[54] ASYNCHRONOUS ANALOG TO LOGIC LEVEL SIGNAL CONVERTER
10 Claims, 3 Drawing Figs.

[52] U.S. Cl. .......... 340/347 AD, 340/347 NT, 320/1
[51] Int. Cl. .......... H03k 13/02
[50] Field of Search .......... 235/183; 328/151; 330/96, 100, 105, 106; 340/347, 347 NT

[56] References Cited

UNITED STATES PATENTS

| | | | |
|---|---|---|---|
| 2,941,196 | 6/1960 | Raynsford | 340/347 NT |
| 3,256,426 | 6/1966 | Roth | 340/347 NT |
| 3,290,563 | 12/1966 | Hyer | 330/1 A |
| 3,296,613 | 1/1967 | Andersen | 235/183 |
| 3,439,272 | 4/1969 | Bailey | 340/347 NT |
| 3,462,758 | 8/1969 | Reynal | 340/347 NT |

*Primary Examiner*—Maynard R. Wilbur
*Assistant Examiner*—Jeremiah Glassman
*Attorneys*—John F. Ahern, Paul A. Frank, Jerome C. Squillaro, Frank L. Neuhauser, Oscar B. Waddell and Joseph B. Forman

ABSTRACT: An asynchronous analog to logic level signal converter is described as comprising a first differential amplifier with means for integrating an input analog signal and applying the integrand signal to a second differential amplifier to produce a logic level output signal having a period, $T_1$, inversely proportional to the amplitude of the input signal. A reference signal controllably applied to the other differential inputs of the first and second differential amplifiers produces a changed logic level having a period, $T_2$, inversely proportional to the difference in amplitudes between the reference signal and the input signal. The amplitude of the input analog signal is obtained by computing the product of the reference voltage and the ratio of $T_2$ to $T_1$ plus $T_2$.

Inventor:
James W. Conley,
by Jerome C. Squillaro
His Attorney.

ASYNCHRONOUS ANALOG TO LOGIC LEVEL SIGNAL CONVERTER

This invention relates to a signal converter and more particularly to an analog to logic level signal converter.

The processing of low-level analog signals such as those obtained from thermocouples, strain gauges and the like is extremely difficult. Particularly troublesome are noise signals or transients which are picked up by the transmission line and cause errors in subsequent processing circuitry. One solution to this problem is the use of an analog to digital converter; however, the conversion of low-level analog signals has previously required complex circuitry in which the accuracy of conversion was largely dependent upon circuit parameters. Recent improvements in analog to digital converters has considerably improved this situation; however, in applications requiring a large number of low-level signals to be converted to digital signals, the problem of gating or switching low-level signals has still presented a very serious problem. Accordingly, there is a serious need for a low-level analog signal converter which can be located close to the signal source, can eliminate the need for switching low-level signals, can reduce the effects of noise and improve the processing and transmission of such signals.

Accordingly, among the objects of the invention are to provide an analog to logic level signal converter which overcomes the foregoing problems and in addition advantageously provides a faster, more accurate and less expensive converter which can be located close to the signal source to reduce noise problems, simplify transmission and reduce subsequent processing time. These and other objects of the invention are attained by providing a converter having an output of a first logic level for a time interval proportional to the integrand of the input analog signal and a second logic level for a time interval proportional to the difference between the input analog signal and a reference signal. This binary signal can be conveniently transferred to a remote central processor where the magnitude of the unknown voltage can be obtained by computing the product of the reference voltage and the ratio of the first time interval to the total time interval. In one embodiment, for example, this is achieved by providing a first differential amplifier with an integrating network connected between the output of the differential amplifier and an inverting input of the amplifier which is also connected to the analog voltage source. A second, noninverting input of the differential amplifier is controllably connected to a reference signal which when applied to the differential amplifier changes the slope of the output voltage of the differential amplifier from the integrand of the unknown analog input signal to the integrand of the difference between the input signal and the reference signal. A second differential amplifier connected to the output of the first differential amplifier produces a change in the binary logic level output each time the slope of the integrand changes polarity. The output of the second differential amplifier is also connected by a feedback circuit to the noninverting inputs of both differential amplifiers at controlled intervals to modify the operation thereof and provide the asynchronous characteristics.

The novel features believed characteristic of the invention are set forth in the appended claims. The invention itself, together with further objects and advantages thereof, may best be understood by reference to the following description taken in connection with the appended drawing wherein:

Figure 1:
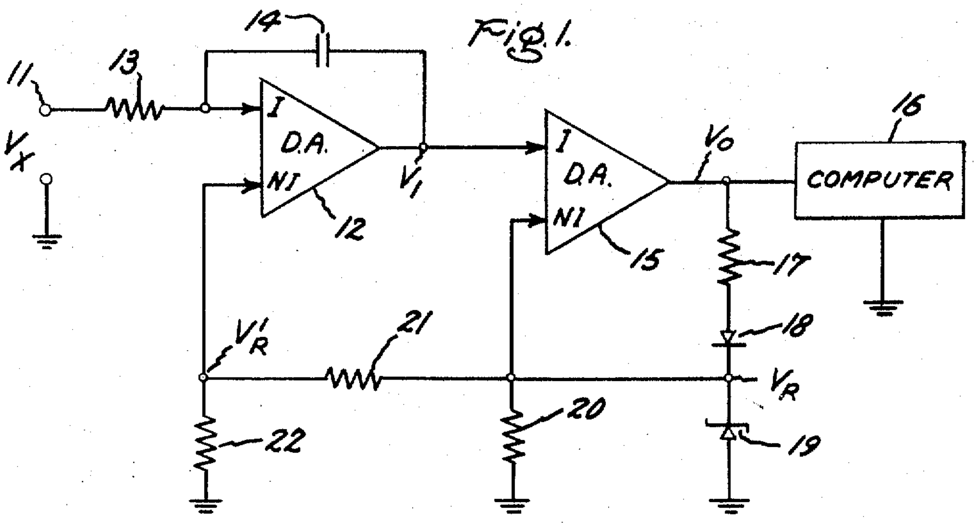
FIG. 1 illustrates a block diagram of a preferred embodiment of the invention.

By way of example, the instant invention is described with reference to FIG. 1 wherein there is illustrated an analog to logic level converter including an input terminal 11, referenced to a ground potential, connected to a first differential amplifier 12 by a resistor 13. The differential amplifier 12 may be any of a variety of differential amplifiers well known in the art. In practicing the instant invention, favorable results are attained by using the Motorola integrated circuit differential amplifier designated MC–1437. This particular amplifier provides a choice of inverting or noninverting inputs and has an extremely high gain characteristic at low frequencies and falls off at a rate inversely proportional to frequency. It is to be understood, however, that this particular differential amplifier is referred to merely by way of illustration and obviously other amplifiers could be used in practicing the instant invention.

Connected as a feedback element between the output of the differential amplifier 12 and the inverting input thereof, is a capacitor 14. The function of the input resistor 13, amplifier 12 and feedback capacitor 14 is to integrate an input analog signal applied at the input terminal 11. By virtue of the inverting characteristic of the differential amplifier 12, the output signal designated as $V_1$, is actually the inverse integrand of the input signal.

The output of the integrating differential amplifier 12 is connected to a second differential amplifier 15, at its inverting input. The output of the differential amplifier 15 is connected through an output terminal to a utilization device such as a computer 16 which accepts the output logic level signal, designated $V_0$ and performs computations thereon as described hereinafter. A portion of the output signal from the differential amplifier 15 is controllably fed back to noninverting inputs of both differential amplifiers. The feedback network includes a resistor 17 having one terminal connected to the output of the differential amplifier 15 and the other terminal connected to the anode of a diode 18. The cathode of the diode 18 is connected to the cathode of a Zener diode 19 which has its anode connected to the common ground potential. The cathode of the Zener diode 19 is also connected to a noninverting input of the differential amplifier 15 and to the ground potential through a resistor 20 and to a voltage divider network comprising series connected resistors 21 and 22. The function of the voltage divider network is to reduce the amplitude of the voltage regulated signal, $V_R$, developed at the cathode of the Zener diode 19 and apply this voltage to a noninverting input of the differential amplifier 12. The reduced or voltage-divided signal connected to the noninverting input of differential amplifier 12 is designated $V'_R$.

Figure 2:
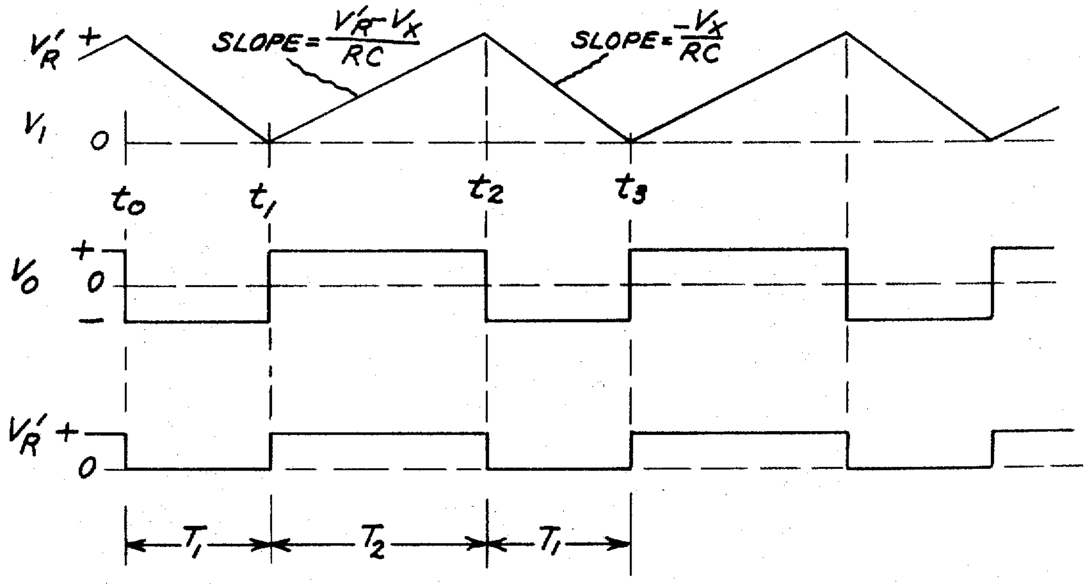
FIG. 2 is a graphical representation of waveforms associated with the circuit of FIG. 1.

In operation, a substantially steady state unknown DC voltage, $V_x$, such as may be obtained from a thermocouple is applied to the input terminal 11. In response thereto, the differential amplifier 12 having a normally positive output voltage, $V_1$, with respect to ground as indicated in FIG. 2 at a time, $t_0$, begins to become less negative and at a time, $t_1$, approaches 0 volts. As also illustrated in FIG. 2, during this time interval, the output logic signal, $V_0$, remains at some negative voltage. When the voltage, $V_1$, reaches a slightly negative value, the output of the differential amplifier 15 immediately switches to a positive voltage. The amount of negative voltage swing required to produce this change is a function of the gain of the amplifier; the speed with which the change is accomplished is a function of the frequency response of the amplifier.

As soon as the output voltage, $V_0$, drives positive, current begins to flow through resistor 17 and diode 18 causing Zener diode 19 to be reverse biased and eventually voltage limit or regulate at a voltage, $V_R$. As described previously, this signal is coupled back to the noninverting input of the differential amplifier 15 which insures that its output voltage, $V_0$, remains positive. The voltage divided signal, $V'_R$, being applied to the noninverting input of the differential amplifier 12, now causes the output thereof to begin to go positive at a rate determined by the time constant 1/RC of the integrating network comprising resistor 13 and capacitor 14. As illustrated in FIG. 2, the slope of the voltage, $V_1$, during this time interval is equal to the voltage difference between the voltage-divided reference potential, $V'_R$, and the unknown input analog voltage $V_x$, multiplied by the time constant of the integrating network.

The integration of the difference voltage continues until a time, $t_2$, at which the positive voltage appearing on the inverting input of differential amplifier 15 slightly exceeds the amplitude of the positive voltage appearing on the noninverting input of the same amplifier. At this time, the output of the differential amplifier 15 abruptly switches from a positive voltage to a negative voltage. This condition is illustrated very clearly in FIG. 2 wherein voltage characteristic, $V_0$, is shown.

With the output voltage, $V_0$, returning to a negative value, the diode 18 becomes reverse biased and prevents the passage of current therethrough. Accordingly, the reference voltage, $V_R$, and its voltage-divided counterpart, $V'_R$, becomes 0 volts. The integrating differential amplifier 12, during this time interval is integrating the analog input signal, $V_x$and the output voltage, $V_1$, is driving from a positive level toward 0 volts at a rate determined by the time constant of the integrating network. The slope of the voltage, $V_1$, during this time interval, $t_2$, to $t_3$, is equal to the input voltage, $V_x$, multiplied by the time constant of the integrating network. As is illustrated in FIG. 2, the cycle continues to repeat on an asynchronous basis.

The period of time, $T_1$, required for the output voltage, $V_1$, to go from a selected positive voltage approximately equal to $V_R$ to 0 volts can therefore be expressed by the following equation:

$$T_1=(V_R RC/V_x)$$

Similarly, the period of time, $T_2$, required for the voltage, $V_1$, to go from 0 volts to plus $V_R$ can be defined by the following equation:

$$T_2=(V_R RC/V'_R-V_x)$$

The total period of time, $T_1+T_2$, is therefore equal to the sum of these two equations and can be expressed as follows:

$$T_1+T_2=V_R RC\left[\frac{1}{V_x}+\frac{1}{V'_R-V_x}\right]$$

Thus, by measuring the times, $T_1$ and $T_2$, preferably by digital counting means, the magnitude of the unknown input voltage, $V_x$, can be determined. Arithmetically, this function can be performed by multiplying $V'_R$ by the ratio of $T_2/(T_1+T_2)$; this computation is conveniently performed by a digital computer.

The asynchronous characteristics of the analog to logic level converter of the instant invention result from the feedback network existing between the output of the differential amplifier 15 and the noninverting inputs of amplifiers 12 and 15. By controllably varying the feedback in the manner described above, the need for synchronous clocks or generators is completely eliminated. Additionally, from the foregoing description, it is apparent that the frequency of the asynchronous operation is determined by the magnitude of the input analog voltage and the time constant of the integrator network. These parameters may be varied by well-known techniques to meet the requirements of any particular application.

Figure 3:
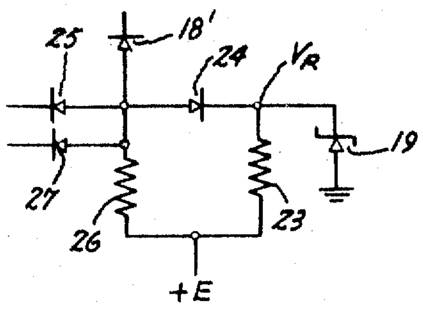
FIG. 3 is a diagram of an alternative embodiment of a feedback circuit.

An alternative embodiment of a feedback network is illustrated in FIG. 3 wherein the diodes 18 and 19 are connected in a slightly different manner. In particular, FIG. 3 illustrates the diode 18 as being connected in a reverse manner and is designated 18'. The Zener diode 19 is connected in the same polarity but is biased from a supply voltage, E, through a resistor 23. The magnitude of the voltage supply, E, is sufficient to develop a voltage, $V_R$, across the Zener diode 19. This voltage is controllably connected through a gate comprising diodes 24 and 25. Both diodes are provided with a forward bias current through a resistor 26 connected to the voltage source, E.

The diode gate illustrated in FIG. 3 operates in substantially the same manner as the network described in FIG. 1. The primary difference being, that in FIG. 3, when the output voltage, $V_0$, is negative, all the current supplied by the resistor 26 is conducted through diode 18' thereby reverse-biasing diodes 24 and 25 and establishing 0 volts at the noninverting inputs of differential amplifiers 12 and 15. However, when $V_0$ becomes positive, diode 18' is reverse-biased and diodes 24 and 25 conduct. In this situation, the voltage, $V_R$, is permitted to pass through the diode gate and is applied to the noninverting input of differential amplifier 15 and the voltage divider network.

The feedback network illustrated in FIG. 1 is much simpler that that of FIG. 3; however, the feedback network of FIG. 3 may be more desirable in some instances since an overriding inhibit signal may be connected through a diode 27 to prevent the output voltage, $V_0$, from changing. This feature is particularly desirable when operating the asynchronous converter in conjunction with a synchronous system. Another desirable feature of this network is that the regulated voltage, $Vr$ is available at all times; this makes it possible to use $Vr$ as an offset voltage against certain input voltages where desirable or necessary.

Having thus described the operation of an embodiment of the invention, it is readily apparent that several important advantages are derived therefrom. In particular, the conversion of low-level analog to logic level signals is now made possible near the source of the analog signal with very simple and inexpensive components. The conversion is independent of circuit parameters and therefore improves accuracy. Additionally, the operation is asynchronous and therefore eliminates the need for additional clocks or gating circuitry. Furthermore, the instant invention may be advantageously operated with a synchronous system if desired.

Although the invention has been described with respect to specific embodiments, it will be appreciated that various changes and modifications may be made by those skilled in the art without departing from the spirit and scope of the invention.

What I claim and desire to be secured by Letters Patent is:

1. An synchronous analog to logic level converter comprising:

integrator means for providing and inverted integral of an analog signal;

amplifier means having a first input responsive to the inverted integrand for providing an output logic signal having a first binary state; and feedback means responsive to said first binary state for providing a reference signal to a second input of said amplifier means and to a second input of said integrator means, said reference signal causing said output of said amplifier means to remain in said first binary state until the amplitude of said integrand exceeds that of said reference signal whereupon said output logic signal changes to a second binary state, the interval of time said output logic signal remains in said first binary state being inversely proportional to the voltage difference between said analog signal and said reference signal.

2. An asynchronous analog to logic level converter as recited in claim 1 wherein said feedback means includes: means for inhibiting said reference signal from being applied to said amplifier means and said integrator means for another interval of time, said other interval of time being inversely proportional to the amplitude of said analog signal, said amplifier means providing an output logic signal of said second binary state during said other interval of time.

3. An asynchronous analog to logic level converter as recited in claim 2 further comprising: means responsive to said logic signal for computing the amplitude of said analog signal.

4. An asynchronous analog to logic level converter as recited in claim 2 wherein said feedback means further comprises:

a first diode operatively connected to the output of said amplifier means to conduct a voltage of a first polarity to the second input of said amplifier means; and a second diode operatively connected to said first diode to regulate the amplitude of the voltage conducted to said second input of said amplifier means.

5. An asynchronous analog to logic level converter as recited in claim 4 wherein said feedback means further comprises:

a diode gate operatively connected to said first and second diodes to selectively pass or inhibit said regulated voltage in accord with the binary state of said output logic signal.

6. An asynchronous analog to logic level converter as recited in claim 5 further comprising:

means for inhibiting said diode gate from passing said regulated voltage regardless of the binary state of said output logic signal.

7. An asynchronous analog to logic level converter as recited in claim 6 further comprising:

voltage divider means connected between said second input of said amplifier means and said second input of said integrator means.

8. An asynchronous analog to logic level converter as recited in claim 4 wherein said feedback means further comprises:

resistor means operatively connected to said first and second diodes for providing a portion of said reference signal to said second input of said integrator means.

9. An asynchronous analog to logic level converter as recited in claim 4 further comprising:

means for computing the amplitude of said analog signal from said logic signal.

10. An asynchronous analog to logic level converter as recited in claim 9 wherein said integrator means and said amplifier means each comprise:

a differential amplifier having an inverting and a noninverting input.